Nov. 18, 1969 P. V. GRAY 3,479,234

METHOD OF PRODUCING FIELD EFFECT TRANSISTORS

Filed May 1, 1967

Inventor:
Peter V. Gray,
by Edward D Murphy
His Attorney.

3,479,234

METHOD OF PRODUCING FIELD EFFECT TRANSISTORS

Peter V. Gray, Scotia, N.Y., assignor to General Electric Company, a corporation of New York Filed May 1, 1967, Ser. No. 634,985
Int. Cl. H01l 7/44
U.S. Cl. 148—187 1 Claim

ABSTRACT OF THE DISCLOSURE

A method of automatically registering the gate region of the thin dielectric of a field effect transistor with a short channel between diffused source and drain regions which includes defining the extent of the gate dielectric simultaneously with the source and drain regions. This definition is accomplished by an etch step which also removes a predeposited impurity source layer except at the source and drain locations which are then produced by a subsequent diffusion.

Figure 1:
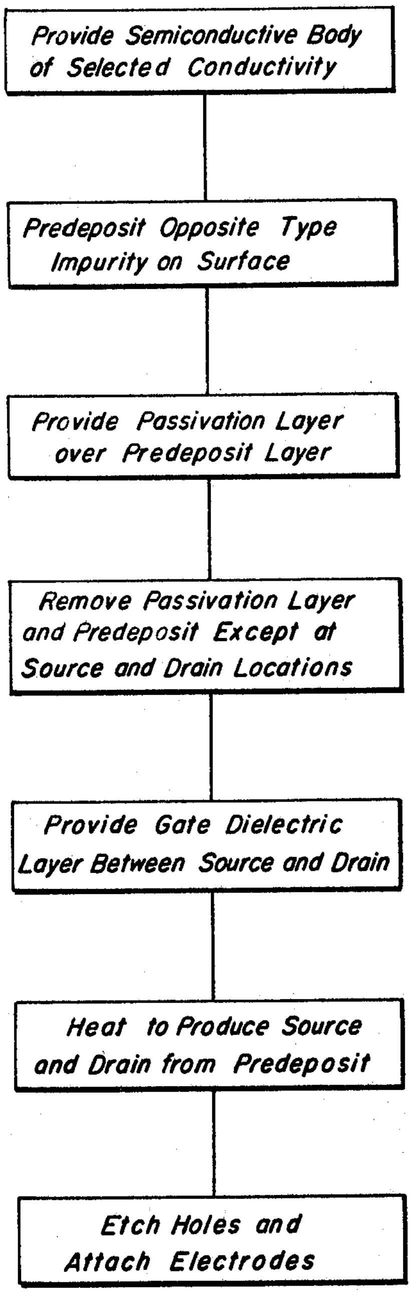

Insulated gate field effect transistors are of utmost importance in the field of integrated circuits because of their useful characteristics combined with small size and low cost. However, the present state of the art in the manufacture of such devices limits the size and the minimum channel length which may be achieved. Size reduction is of substantial importance because circuits having a smaller area are substantially less likely to be rejected due to defects in the semiconductor wafer. In the particular case of field effect transistors (hereafter FET), reduction of the channel length increases the transductance and decreases the internal capacitance, both of which increase the switching speed.

The prior method of producing FET's, in accord with conventional planar diffused junction technology, comprises cutting a pair of holes through an oxide on a silicon wafer, producing source and drain regions by diffusing an impurity through the holes, attaching electrodes to the source and drain regions and providing an electrode on the oxide over the gate region between the source and drain. Due to the necessity of registering the gate electrode over this region, a large sacrifice in the direction of increased size must be made, thus reducing the transconductance, increasing the capacity and substantially decreasing the switching speed. Even acceptance of these disadvantages in devices still requires precision which, by prior methods, can only be achieved through skill and expense. The present invention is directed to a method of producing FET's which permits a substantial reduction in size and thus permits the manufacture of greatly improved devices, and which permits the easy and inexpensive fabrication of devices which are, at present, difficult and expensive to fabricate.

Accordingly, it is an object of this invention to provide a new and improved method of producing insulated gate FET's.

It is also an object of this invention to provide a method of fabricating FET's in which the channel length is substantially less than in those obtained by previous methods.

Another object of this invention is the provision of a method of automatically registering the gate dielectric of a FET with the gate region.

A further object of this invention is to provide a simple and inexpensive method of producing insulated gate FET's.

Briefly, in accord with one embodiment of this invention, I provide a method of fabricating field effect transistors having diffused source and drain regions which includes defining the boundaries of the source and drain regions simultaneously with the definition of the thin dielectric region which overlies the surface between the source and drain junctions. Specifically, this is done by performing a predeposition of a highly concentrated layer of the impurity to be diffused on the surface of the semiconductor body in which the devices are to be fabricated, preparing a passivation layer on top of the predeposited impurity, removing the passivation layer and the predeposited layer at all locations other than those at which the source and drain regions are to be diffused, providing a thin dielectric layer over the gate region between the predeposited layers from which the diffusion will proceed, and heating the device to diffuse in the source and drain regions from the remaining portions of the predeposited layer.

The novel features believed characteristic of the invention are set forth in the appended claims. The invention itself, together with further objects and advantages thereof may best be understood by reference to the following description taken in connection with the appended drawings in which:

FIGURE 1 is a flow chart representing the steps in a preferred embodiment of the method of this invention; and FIGURES 2A–G are cross-sectional views illustrating the structure of the wafer corresponding to the successive steps of FIGURE 1.

Semiconductive field effect transistors generally include a body of selected conductivity type material having a pair of regions of opposite type conductivity therein. The opposite type regions, termed the source and drain regions, are located at one surface of the body and are disposed so that predetermined portions of their junctions are spaced a small distance apart. A gate electrode is positioned over the surface between the source and drain regions in a position to overlap the spaced junctions and is insulated therefrom by a layer of insulating material. This layer, termed the gate dielectric, is thin enough to permit interaction of an electric field, applied between the gate electrode and the body, with carriers in a thin channel adjacent the surface of the body and extending between the junctions. In operation, electrodes are attached to the source and drain regions and current therebetween through the channel is controlled by the magnitude of the field applied to the gate electrode. If the source and drain regions are of p-type material, the device is termed a p-channel FET. A FET may be either an enhancement mode device, in which case carriers are attracted into the channel by the gate field when it is desired to turn the device on, or a depletion mode device, in which case carriers are driven out of the channel by the gate field when it is desired to turn the device off. Typically, such devices are prepared on silicon although other materials such as germanium and the III–V compounds may also be used.

In accord with the terminology normally used in describing FET's, the distance across the channel between the source and drain regions is herein referred to as the "length" even though this is actually the shorter dimension of the area over which the channel extends. Similarly, the corresponding dimension of the gate dielectric and of the gate electrode is also referred to as the length.

In FIGURE 1, the steps performed in a preferred embodiment of this invention are set forth and the illustrations of FIGURES 2A–G show the device at the corresponding stage of processing. It is noted that the relative dimensions illustrated in these drawings are not in true proportion; in actual fabrication, approximately 1000 or more of these devices may be fabricated on a single wafer of semiconductive material and all of the process discussed herein may take place within the first few microns of a device several mils (thousandths of an inch) thick. In addition, the gate region may have any desired configuration. For clarity of illustration, only a single device having simple source, drain and gate regions has been shown and the relative dimensions have been adjusted as needed.

The first step is to select a wafer 1 of semiconductive material, for example, silicon, germanium or other semiconductive materials such as gallium arsenide or gallium phosphide, which is doped with an impurity to provide a selected conductivity and which has a major surface 2. Next, a layer 3, herein termed the predeposited layer, is produced containing an impurity which, when diffused into the semiconductive body 1, will produce opposite type conductivity. This predeposition may be done by any desired method, for example, by performing a very shallow but heavily concentrated diffusion or by heating the wafer in an atmosphere containing an oxide of the impurity to form a silicate glass containing the impurity. It is noted that the body 1 should not be heated to a high tempreature for a long period of time during this predeposition as deep diffusion of the impurity into the body is not desired at this time.

Next, a passivation layer 4 is produced on the surface of the predeposited layer 3 by any conventional method. The material of the passivation layer may be any suitable insulator which insulates the underlying layer against electrical contact or interaction and protects it against chemical contamination. For example, silicon dioxide produced by sputtering or pyrolysis may be used. It is noted that this layer is sufficiently thick to electrically passivate the underlying semiconductor; that is, thick enough so that the capacitive effect, which arises when a metal is spaced from a semiconductor, is so small that it is not of significance in the operation of the device. For optimum passivation, it is preferred that the glass known as silicon oxynitride, described and claimed in the copending application of F. K. Heumann, Ser. No. 598,305, filed Dec. 1, 1966 and assigned to the assignee of this invention be used.

Figure 2A:
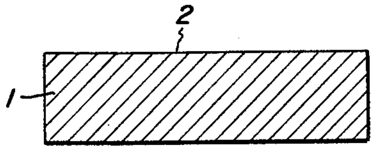
Figure 2B:
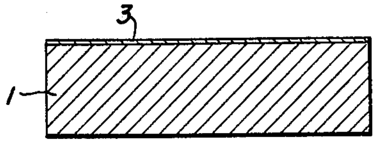
Figure 2C:
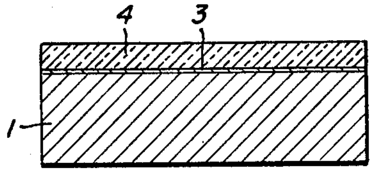
Figure 2D:
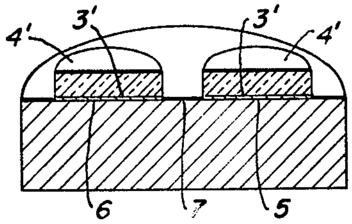

The fourth step of this invention, FIGURE 2D, is to remove the predeposited layer and the passivation layer from the entire surface o fthe semiconductor except as shown at 3' and 4' which indicate the portions of these layers left at the locations 5, 6 of the source and drain regions. That is, these layers are removed from the area of the semiconductive body surrounding the active device and from the gate region 7 which is the location of the channel to be established between the source and drain regions. This removal is done by the customary photoresist masking and etching technique the materials used being selected as required by the particular passivation layer. To etch away a predeposited layer of doped silicon, for example, a solution of 10 parts $HNO_3$ and 1 part HF may be used. The passivation layer and the predeposited layer are left in place at the source and drain locations 5 and 6.

Figure 2E:
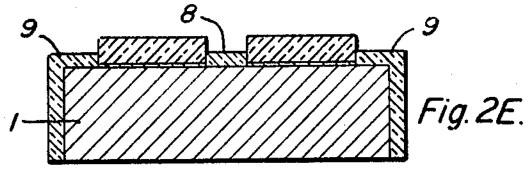

Next, as shown in FIGURE 2E, a gate dielectric 8 is formed over the gate region 7 between the source and drain regions 5 and 6. This dielectric may also extend over other regions of the device as at 9 where it helps to partially passivate the surface. The gate dielectric may be any dielectric material which is compatible with the semiconductor, such as silicon dioxide or the previously mentioned silicon oxynitride. This material and that of the passivation layer have similar properties and are usually identical, the functional difference between them being due to the difference in thickness. The passivation layer is generally about 0.5 to 1.5 microns thick while the gate dielectric is about 0.05 to 0.15 micron thick. In the case of a silicon semiconductive body, the gate dielectric is preferably formed by heating the body in an oxygen atmosphere which converts a portion of the surface to silicon dioxide. For example, heating the body to a temperature of 1000° C. for 120 minutes in dry oxygen produces a layer of silicon dioxide 0.1 micron thick on the surface.

Figure 2F:
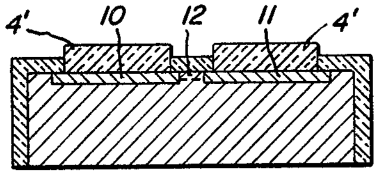

The source and drain regions 10 and 11 are next diffused into the body 1, as shown in FIGURE 2F. This step may alternatively be performed at any time after the etching step which limits the predeposited layer to the source and drain regions. For example, it may be performed before depositing the gate dielectric or after the gate electrode is in place. The diffusion is accomplished by heating the body to a suitable temperature for the time required to diffuse the impurity to the required depth. These parameters are variable depending on the impurity, the material of body 1 and the depth and concentration desired. As an example, a temperature of 1100° C. for one hour is sufficient to diffuse boron into silicon to a depth of 2 microns. The channel 12 is the distance remaining between these junctions after this diffusion.

Figure 2G:
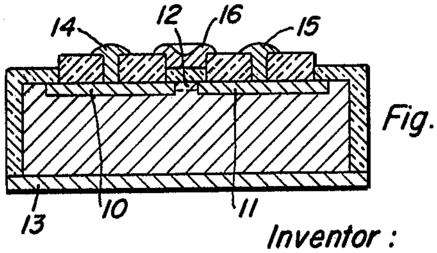

Finally, as illustrated in FIGURE 2G, the device is completed by attaching a base electrode 13 which may also serve as a support and/or heat sink; attaching source and drain electrodes 14 and 15 by etching through the passivation layer and depositing a metal such as aluminum; and, similarly, depositing the gate electrode 16 in the depression caused by the difference in thickness between the gate dielectric and the passivation layer.

The improvement obtained in accord with this invention arises from the ability to simultaneously define both the extent of the gate dielectric and the boundaries of the source and drain region. In the preferred embodiment, this is accomplished in the step illustrated in FIGURE 2D. The predeposited layer 3 supplies the impurity which is diffused into the body 1 to produce the source and drain regions. Thus, the step of removing the passivation layer and all of the predeposited layer except at the source and drain locations defines the extent of these regions and the short channel therebetween. It is noted that the depth of impurity diffusion and the extent of diffusion beyond the edge of the predeposited layer (which is nearly equal to the depth) is easily and precisely controlled by controlling the temperature and time at which the diffusion is performed. At the same time, the removal of the passivation layer defines a region for the preparation of a gate dielectric which has the minimum possible length. That is, because the photolithographic etching process which can be controlled to remove only a very small portion of the predeposited layer and thus to produce only a small area 7 for the thin dielectric, and because both the source-drain spacing and the location of the short gate dielectric are defined in one step, registration is achieved automatically of a very short gate dielectric with a very short source-drain channel.

In numerical terms, it is possible, with conventional photolithographic methods, to define a separation between regions 5 and 6 in FIGURE 2D of approximately 2 microns, and to control diffusion from the predeposited impurity layer remaining at these regions so that it extends no more than ½ micron into this 2 micron-long space. However, since the source and drain regions are already covered by a passivation layer, the gate dielectric may be provided in the same slot where it automatically registers within these limits over the source and drain junctions. Thus, the long channel and the long region of gate dielectric, required by the conventional process so that the later-etched gate region overlaps the channel, are eliminated. Also by this method, longer channel lengths, for example up to 15 microns, are very easily and inexpensively achieved. The prior art even at best has required approximately a 6 micron long gate dielectric and a 3 micron long channel to achieve this registration and even devices with twice these parameters are still very difficult and expensive to manufacture. Thus, in terms of the exemplary numbers stated, which represent the best presently obtainable by the respective methods, the present invention achieves a factor of three increase in transconductance (since the channel length is decreased by that factor) and also achieves a factor of three reduction in capacity (since the length of the gate dielectric and correspondingly the area over which the gate electrode is close to the surface is reduced by that factor). Thus, the speed of the device is increased by approximately one order of magnitude. In more practical terms, devices having a channel length in the range of 6 to 15 microns can only be produced, by the prior art, by processes requiring skill and care and attendant expense. Even then, the reject rate is very high. By the method of this invention, devices in this range can be fabricated easily and precisely, due to the fact that the thin dielectric and the channel are automatically registered and the alignment or registration step, the cause of most of the difficulty in prior methods, is eliminated.

It is noted that the mask which defines the gate electrode deposition must have an opening somewhat larger than the gate dielectric to allow for misregistration if the mask is not aligned with the gate dielectric; however, this overlap of metal does not matter since the off-gate deposition which occurs will be separated from the surface by the thick passivation layer and will not significantly increase the capacitive coupling.

The method described above has been set forth in terms of the simplest series of steps which accomplishes the objects of this invention. It is noted that, in actual use, these steps may be modified as required by a given device or circuit. For example, to achieve passivation of the entire surface of the body 1, it may be desirable to leave the passivation layer and the predeposited layer in place over the channel during the etching of the wafer shown in FIGURE 2C, form a new passivation layer over the exposed surface, and then etch away the passivation and predeposited layers in the gate region. In this manner, the thin dielectric is provided only at the gate region; thus, any metal overlays required to connect the device in a circuit are spaced from the body by the passivation layer and are not capacitively coupled to the device. Other adjustments may be made in the process to accommodate it to the formation of other devices on the same wafer.

Another alternative within the scope of this invention which should be noted is that of defining the gate dielectric and the source and drain boundaries simultaneously by diffusing the impurity to its full depth into the surface 2 (instead of predepositing a shallow layer as in FIGURE 2B), passivating the entire surface as in FIGURE 2C, etching to a depth sufficient to separate the passivation layer and the diffused region into two parts and depositing the gate dielectric in the etched region so that it extends from one part of the passivation layer to the other and covers all of the exposed surface therebetween. In this case, the channel extends in the undiffused region of the body beneath the etched out portion.

The following examples are set forth to exemplify the practice of this invention. These examples include specific values of the parameters involved so that the invention may be practiced by those skilled in the art. It is noted however, that these examples are provided for purposes of illustration only and are not to be construed in a limiting sense.

EXAMPLE 1

A p-channel enhancement mode FET is prepared by providing a wafer of silicon doped with phosphorous to have n-type conductivity of $10^{16}$ carriers per cc. A layer of boron is predeposited on a major surface of the wafer by heating to a temperature of 1100° C. in an atmosphere of $B_2O_3$ for 10 minutes. Next, a 1 micron layer of silicon dioxide is sputtered onto the surface so as to overlie the predeposited layer. The locations of the source and drain regions are masked and the remainder of the passivation layer is etched away by conventional photoresist techniques. The predeposited layer is also removed from the surface except at the source and drain locations. The space between the passivation layer and predeposited layer at the source and drain locations after this step is 2 microns. A layer of silicon dioxide approximately 0.1 micron thick is grown over the exposed surface regions by heating the wafer in oxygen to a temperature of 1000° C. for 2 hours. The oxygen atmosphere is removed and the heating is continued at a temperature of 1100° C. for one hour to complete the diffusion of the source and drain regions.

Next, a suitable mask is deposited over the device and source and drain contact holes are etched. Electrode attachment is now performed by aluminum deposition through a suitable mask such as a photoresist. The aluminum deposits over the gate region and in the source and drain contact holes and is removed from the masked areas by heating the photoresist. Other electrode areas such as interconnections and wire landing pads are prepared at this time.

A specific field effect transistor fabricated in accord with the above technique exhibits a transconductance of 3000 micromhos and a switching speed, from OFF-to-OFF, of 2 nanoseconds. The best available prior art field effect transistor, similar in all respects except for gate dielectric length and channel length, exhibits a transconductance of 1000 micromhos and a switching speed over a similar cycle of 18 nanoseconds.

EXAMPLE 2

An n-channel depletion mode FET is prepared by providing a wafer of silicon doped with boron to have p-type conductivity of $10^{16}$ carriers per cc. A layer of phosphorous is predeposited on a major surface wafer by shallow diffusion of a highly concentrated region. Next, a 1 micron layer of silicon dioxide is sputtered onto the surface so as to overlie the predeposited layer. The locations of the source and drain regions are masked and the remainder of the passivation layer is etched away by conventional photoresist techniques. The predeposited layer is also removed from the surface except at the source and drain locations. The space between the passivation layer and predeposited layer at the source and drain locations after this step is 2 microns. A layer of silicon dioxide approximately 0.1 micron thick is grown over the exposed surface regions by heating the wafer in oxygen to a temperature of 1000° C. for 2 hours. The oxygen atmosphere is removed and the heating is continued at a temperature of 1100° C. for 10 minutes to complete the diffusion of the source and drain regions.

Next, a suitable mask is deposited over the device and source and drain contact holes are etched. Electrode attachment is now performed by aluminum deposition through a suitable mask such as a photoresist. The aluminum deposits over the gate region and in the source and drain contact holes and is removed from the masked areas by heating the photoresist. Other electrode areas such as interconnections and wire landing pads are prepared at this time.

A specific effect transistor fabricated in accord with the above technique exhibits a transconductance of 3000 micromhos and a switching speed, from OFF-to-OFF, of 2 nanoseconds. The best available prior art field effect transistor, similar in all respects except for gate dielectric length and changed length, exhibits a transconductance of 1000 micromhos and a switching speed over a similar cycle of 18 nanoseconds.

While I have shown and described several embodiments of my invention, it will be apparent to those skilled in the art that many changes and modifications may be made without departing from my invention in its broader aspects; and I therefore intend the appended claims to cover all such changes and modifications as fall within the true spirit and scope of my invention.

What I claim as new and desire to secure by Letters Patent of the United States is:

1. A method of fabricating field effect transistors which include a semiconductive body having impurity-diffused source and drain regions therein located so that a portion of their boundaries are juxtaposed, a gate dielectric layer on the surface of said body located at a gate region between said boundary portions and an electrode on said gate dielectric layer to control conduction between said regions, comprising the steps of: providing a silicon semiconductive body of selected conductivity type and having a major surface; providing a silicon oxynitride passivation layer over said surface of said body; preparing an opening in said passivation layer; providing a gate dielectric layer of silicon dioxide on the surface exposed in said opening; producing said source and drain regions of said body, the juxtaposed boundaries thereof being defined by said opening; and including the steps of predepositing an impurtiy layer on said surface of said semiconductive body; producing said passivation layer over said predeposited layer; etching away said passivation layer and said predeposited layer from all portions of said surface except where diffusion of said source and drain regions is desired and defining thereby said juxtaposed boundaries; preparing said gate dielectric material at least between said juxtaposed boundaries; diffusing said impurity a predetermined distance into said body from the remaining portions of said impurity layer and providing a conductive electrode over said thin dielectric material.

References Cited

UNITED STATES PATENTS

| | | | |
|---|---|---|---|
| 2,929,006 | 3/1960 | Herlet | 317—235 |
| 2,975,080 | 3/1961 | Armstrong | 148—189 X |
| 3,241,013 | 3/1966 | Evans | 317—235 |
| 3,246,173 | 4/1966 | Silver. | |
| 3,104,991 | 9/1963 | MacDonald. | |
| 3,387,358 | 6/1968 | Heiman | 29—571 |

PAUL M. COHEN, Primary Examiner

U.S. Cl. X.R.

29—571, 577, 580, 588; 148—189; 317—235